(12) United States Patent
Zhou

(10) Patent No.: US 9,985,144 B2
(45) Date of Patent: May 29, 2018

(54) FINFET VARACTOR

(71) Applicant: SEMICONDUCTOR MANUFACTURING INTERNATIONAL (SHANGHAI) CORPORATION, Shanghai (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days. days.

(21) Appl. No.: 15/400,201

(22) Filed: Jan. 6, 2017

(65) Prior Publication Data

US 2018/0006162 A1  Jan. 4, 2018

(30) Foreign Application Priority Data

Jul. 1, 2016  (CN) .......................... 2016 1 0512157

(51) Int. Cl.
*H01L 29/93*  (2006.01)
*H01L 21/84*  (2006.01)
(Continued)

(52) U.S. Cl.
CPC ........ *H01L 29/93* (2013.01); *H01L 21/76895* (2013.01); *H01L 21/823431* (2013.01);
(Continued)

(58) Field of Classification Search
CPC ................. H01L 29/93; H01L 29/0649; H01L 21/823431; H01L 21/76895; H01L 29/66174; H01L 29/66545; H01L 29/66795; H01L 21/823475; H01L 29/41791; H01L 29/0688; H01L 29/1079; H01L 29/0847; H01L 29/41783; H01L 29/78; H01L 29/7851; H01L 21/823437;

(56) References Cited

U.S. PATENT DOCUMENTS 8,765,546 B1 *  7/2014  Hung .............. H01L 21/823431
                                                    257/190
2012/0223392 A1 *  9/2012  Okada ............... H01L 27/11803
                                                    257/369
(Continued)

*Primary Examiner* — Bitew Dinke
(74) *Attorney, Agent, or Firm* — Kilpatrick Townsend & Stockton LLP

(57) ABSTRACT

A varactor transistor includes a semiconductor fin having a first conductivity type, a plurality of gate structures separated from each other and surrounding a portion of the semiconductor fin. The plurality of gates structures include a dummy gate structure on an edge of the semiconductor fin, and a first gate structure spaced apart from the dummy gate structure. The dummy gate structure and the gate structure each include a gate insulator layer on a surface portion of the semiconductor fin, a gate on the gate insulator layer, and a spacer on the gate. The varactor transistor also includes a raised source/drain region on the semiconductor fin and between the dummy gate structure and the first gate structure, the raised source/drain region and the gate of the dummy gate structure being electrically connected to a same potential.

13 Claims, 13 Drawing Sheets

(51) Int. Cl.
- *H01L 29/78* (2006.01)
- *H01L 29/417* (2006.01)
- *H01L 29/08* (2006.01)
- *H01L 29/10* (2006.01)
- *H01L 29/06* (2006.01)
- *H01L 29/66* (2006.01)
- *H01L 21/768* (2006.01)
- *H01L 21/8234* (2006.01)

(52) U.S. Cl.
CPC ........ *H01L 21/823437* (2013.01); *H01L 21/823475* (2013.01); *H01L 29/0649* (2013.01); *H01L 29/0688* (2013.01); *H01L 29/0847* (2013.01); *H01L 29/1079* (2013.01); *H01L 29/41783* (2013.01); *H01L 29/41791* (2013.01); *H01L 29/66174* (2013.01); *H01L 29/66545* (2013.01); *H01L 29/66795* (2013.01); *H01L 29/7851* (2013.01)

(56) References Cited

U.S. PATENT DOCUMENTS

| | | | | |
|---|---|---|---|---|
| 2013/0292777 A1* | 11/2013 | Liaw | ............ | G11C 11/412 257/369 |
| 2014/0332883 A1* | 11/2014 | Kwon | ............ | H01L 27/0886 257/336 |
| 2015/0155383 A1* | 6/2015 | Chang | ............ | H01L 29/7843 257/401 |
| 2015/0340466 A1* | 11/2015 | Fukuda | ............ | H01L 29/66636 257/190 |
| 2016/0020210 A1* | 1/2016 | Liaw | ............ | H01L 29/66545 257/369 |
| 2016/0086950 A1* | 3/2016 | Eom | ............ | H01L 21/823821 257/192 |
| 2016/0099181 A1* | 4/2016 | Tung | ............ | H01L 21/823821 257/369 |
| 2016/0104645 A1* | 4/2016 | Hung | ............ | H01L 21/823437 257/401 |
| 2016/0211251 A1* | 7/2016 | Liaw | ............ | H01L 27/0207 |
| 2016/0225867 A1* | 8/2016 | Kim | ............ | H01L 29/4966 |
| 2016/0284695 A1* | 9/2016 | Liaw | ............ | H01L 27/088 |
| 2016/0284705 A1* | 9/2016 | Chung | ............ | H01L 27/0924 |
| 2016/0343709 A1* | 11/2016 | Kim | ............ | H01L 27/0886 |
| 2016/0351565 A1* | 12/2016 | Sung | ............ | H01L 27/0886 |
| 2017/0154823 A1* | 6/2017 | Tseng | ............ | H01L 21/0228 |
| 2017/0170071 A1* | 6/2017 | You | ............ | H01L 21/823431 |
| 2017/0170315 A1* | 6/2017 | Ok | ............ | H01L 29/7845 |
| 2017/0207129 A1* | 7/2017 | Tseng | ............ | H01L 21/823475 |
| 2017/0345914 A1* | 11/2017 | Smith | ............ | H01L 21/30604 |

* cited by examiner

FINFET VARACTOR

CROSS-REFERENCES TO RELATED APPLICATIONS

The present application claims priority to Chinese patent application No. 201610512157.1, filed with the State Intellectual Property Office of People's Republic of China on Jul. 1, 2016, the content of which is incorporated herein by reference in its entirety.

FIELD OF THE INVENTION

The present invention relates to integrated semiconductor devices, and more particularly to a FinFET varactor and method for manufacturing the same.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have good control capability of gates to effectively suppress the short channel effect. FinFET devices can also reduce random dopant fluctuation to improve the device stability. Thus, FinFET devices are widely used in the design of small-sized semiconductor elements.

In radio frequency (RF) circuit, the variable capacitance (varactor) MOS transistor is an important component. In the manufacturing process of a fin-type varactor MOS transistor, after the removal of an initial dummy gate polysilicon, the epitaxially formed source and drain have an irregular morphology, thereby affecting the device performance.

BRIEF SUMMARY OF THE INVENTION

The present inventor discovered that the epitaxial morphology of the source and drain of a FinFET is affected by the removal of the dummy polysilicon gate and provides a novel varactor design and method of manufacturing the same to overcome the problems.

Embodiments of the present invention provide a varactor transistor. The varactor transistor includes a semiconductor fin having a first conductivity type, a plurality of gate structures separated from each other and surrounding a portion of the semiconductor fin. The plurality of gates structures include a dummy gate structure on an edge of the semiconductor fin and a first gate structure spaced apart from the dummy gate structure. The dummy gate structure and the gate structure each include a gate insulator layer on a surface portion of the semiconductor fin, a gate on the gate insulator layer, and a spacer on the gate. The varactor transistor also includes a raised source/drain region on the semiconductor fin and between the dummy gate structure and the first gate structure. The raised source/drain region and the gate of the dummy gate structure are electrically connected to a same potential.

In one embodiment, the varactor transistor further includes a substrate having a second conductivity type different from the first conductivity type, the semiconductor fin on the substrate and a reverse pn junction formed between the semiconductor fin and the substrate.

In one embodiment, the dummy gate structure includes a first dummy gate structure on a first edge of the semiconductor fin and a second dummy gate structure on a second edge of the semiconductor fin, the first and second dummy gate structures are disposed on opposite sides of the first gate structure.

In one embodiment, the raised source/drain region includes a source disposed between the first dummy gate structure and the first gate structure, and a drain disposed between the second dummy gate structure and the first gate structure.

In one embodiment, the varactor transistor further includes a first contact to the raised source/drain region and a dummy gate contact to the gate of the dummy gate structure, the first contact and the dummy gate contact are electrically connected to each other.

In one embodiment, the first contact includes a source contact connected to the source and a drain contact connected to the drain. The dummy gate contact includes a first dummy gate contact connected to the gate of the first dummy gate structure and a second dummy gate contact connected to the gate of the second dummy gate structure. The source contact, the drain contact, the first dummy gate contact and second dummy gate contact are connected to each other. In one embodiment, the source contact, the drain contact, the first dummy gate contact and second dummy gate contact are connected to ground.

In one embodiment, the varactor transistor further includes a trench isolation structure around the semiconductor fin and having a trench adjacent to the semiconductor fin and a first insulating layer in the trench.

In one embodiment, the varactor transistor further includes an interlayer dielectric layer surrounding the plurality of gate structures and a portion of the source contact and a portion of the drain contact on the first insulator layer.

In one embodiment, the varactor transistor further includes a first dielectric layer surrounding the first dummy gate contact, a portion of the first source contact and a portion of the first drain contact. The first dielectric layer exposes an upper surface of the first dummy gate contact, the second dummy gate contact, the source contact, and the drain contact.

In one embodiment, the varactor transistor further includes a metal connector on the first dielectric layer and in contact with the first dummy gate contact, the second dummy gate contact, the source contact, and the drain contact.

In one embodiment, the varactor transistor further includes an initial insulator layer between the interlayer dielectric layer and the semiconductor fin.

In one embodiment, the gate insulator layer includes an interface layer on a surface portion of the semiconductor fin and a high-k dielectric layer on the interface layer. The gate includes a work function adjusting layer on the high-k dielectric layer on the interface layer and a conductive material layer on the work function adjusting layer.

Embodiments of the present invention also provide a method of manufacturing a varactor transistor. The method may include providing a semiconductor structure including a semiconductor fin having a first conductivity type and an initial insulator layer on the semiconductor fin, and forming a plurality of initial dummy gate structures separated from each other and surrounding a portion of the semiconductor fin. The plurality of initial dummy gate structures includes at least an edge initial dummy gate structure on an edge of the semiconductor fin, and a first initial dummy gate structure spaced apart from the edge initial dummy gate structure, the edge initial dummy gate structure and the first initial dummy gate structure each including an initial gate insulator layer on a surface portion of the semiconductor fin, an initial gate on the initial gate insulator layer, and a spacer on the initial gate. The method also includes forming a raised source/drain region on the semiconductor fin and between each of the initial dummy gate structures, forming an interlayer dielectric layer surrounding the plurality of initial dummy gate structures and the raised source/drain region and exposing an upper surface of the initial gates of the plurality of initial dummy gate structures, removing the exposed initial gates and portions of the initial insulator layers below the exposed initial gates to form a plurality of recesses, and forming a gate insulator layer in the plurality of recesses and gates on the gate insulator to form a plurality of gates structures separated from each other. The plurality of gates structures include at least a dummy gate structure on the edge of the semiconductor fin and a first gate structure spaced apart from the dummy gate structure. The method may further include forming a first dielectric layer on the interlayer dielectric layer covering the plurality of gates structures, forming a first contact through the first dielectric layer and the interlayer dielectric layer to the source/drain region and a dummy gate contact through the first dielectric layer to the gate of the dummy gate structure, and forming a metal connector on the first dielectric layer in contact with the dummy gate contact and the first contact.

In one embodiment, the dummy gate structure includes a first edge dummy gate structure on a first edge of the semiconductor fin and a second edge dummy gate structure on a second edge of the semiconductor fin, the first and second edge dummy gate structures being disposed on opposite sides of the first gate structure.

In one embodiment, the raised source/drain region includes a source disposed between the first dummy gate structure and the first gate structure, and a drain disposed between the second dummy gate structure and the first gate structure.

In one embodiment, the first contact includes a source contact connected to the source and a drain contact connected to the drain. The dummy gate contact includes a first dummy gate contact connected to a gate of the first edge dummy gate structure and a second dummy gate contact connected to a gate of the second edge dummy gate structure. The metal connector connects to the source contact, the drain contact, the first dummy gate contact and the second dummy gate contact.

In one embodiment, the semiconductor structure further includes a trench isolation structure around the semiconductor fin, the trench isolation structure includes a trench adjacent to the semiconductor fin and a first insulator layer in the trench.

In one embodiment, the gate insulator layer includes an interface layer on a portion of a surface of the semiconductor fin and a high-k dielectric layer on the interface layer. In one embodiment, the gate includes a work function adjusting layer on the high-k dielectric layer, and a conductive material layer on the work function adjusting layer.

The following detailed description together with the accompanying drawings will provide a better understanding of the nature and advantages of the present invention.

DETAILED DESCRIPTION OF THE INVENTION

Figure 1:
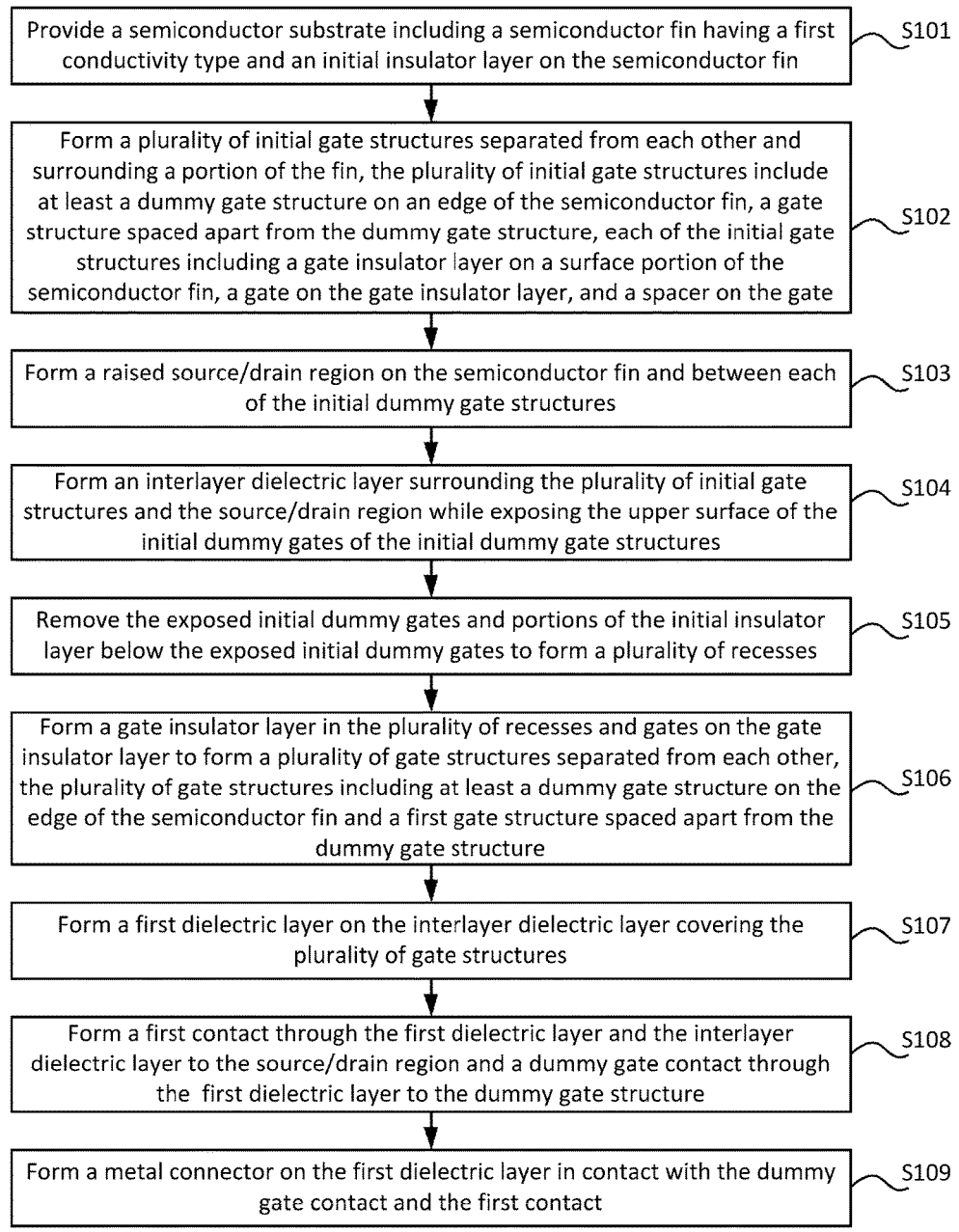
FIG. 1 is a flowchart of a method for manufacturing a varactor transistor according to some embodiments of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIG. 1 is a flowchart of a method for manufacturing a varactor transistor according to some embodiments of the present invention. FIGS. 2 through 15 are cross-sectional views illustrating intermediate stages of a varactor transistor manufactured with a method according to some embodiments of the present invention.

Referring to FIG. 1, the method may include the following process steps:

At S101: providing a semiconductor structure. The semiconductor structure includes a semiconductor fin having a having a first conductivity type and an initial insulator layer on at least a portion of the surface of the semiconductor fin.

Figure 2:
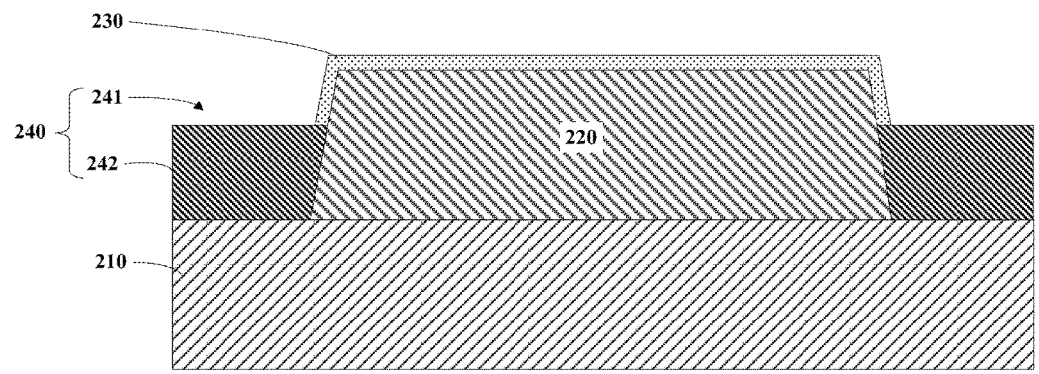
FIGS. 2-15 are cross-sectional views illustrating intermediate stages of a varactor transistor manufactured with a method according to some embodiments of the present invention.

FIG. 2 is a cross-sectional view illustrating an intermediate stage of a semiconductor structure according to S101. As shown in FIG. 2, a semiconductor structure is provided. The semiconductor structure may include a semiconductor fin 220 having a first conductivity type and an initial insulator layer 230 on at least a portion of the surface of semiconductor fin 220. Semiconductor fin 220 may include silicon. Initial insulator layer 230 may include silicon dioxide. The manufacturing process of the semiconductor structure will be described in detail later below.

In one embodiment, as shown in FIG. 2, the semiconductor structure may also include a substrate 210 having a second conductivity type that is different from the first conductivity type. For example, when the first conductivity type is p-type, the second conductivity type is n-type. Conversely, when the first conductivity type is n-type, the second conductivity type is p-type. Semiconductor fin 220 is formed on substrate 210, and a reverse pn junction is formed between semiconductor fin 220 and substrate 210. The substrate may include silicon.

In one embodiment, still referring to FIG. 2, the semiconductor structure may further include a trench isolation structure 240 surrounding semiconductor fin 220. Trench isolation structure 240 may include a trench 241 adjacent to semiconductor fin 220 and filled with a first insulator layer 242. First insulator layer 242 may include silicon dioxide.

Referring back to FIG. 1, at S102, the method may further include forming a plurality of dummy gate structures surrounding a portion of the semiconductor fin. The dummy gate structures are separated from each other.

Figure 3:
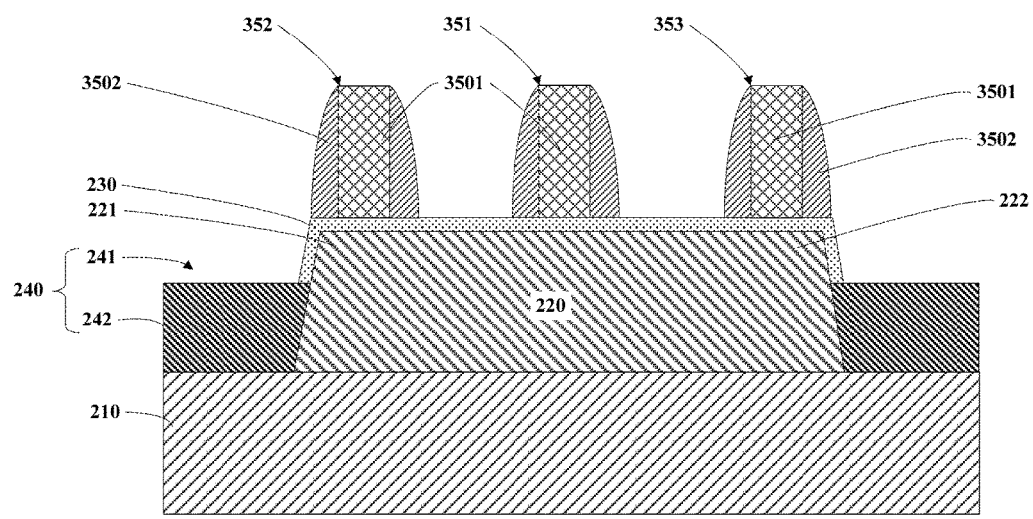

FIG. 3 is a cross-sectional view illustrating an intermediate stage of a semiconductor device according to S102. As shown in FIG. 3, a plurality of initial dummy gate structures are formed surrounding a portion of semiconductor fin 220. The plurality of initial dummy gate structures include at least an edge initial dummy gate structure on an edge of the semiconductor fin and a first initial dummy gate structure 351 spaced apart from edge initial dummy gate structure. Each of the plurality of initial dummy gate structures may include an initial dummy gate 3501 on a portion of the surface of initial insulator layer 230 and a spacer 3502 on sidewalls of initial dummy gate 3501. Initial dummy gate 3501 may include polysilicon. Spacer 3502 may include silicon nitride.

In one embodiment, at S102, as shown in FIG. 3, the edge initial dummy gate structure may include a first edge dummy gate structure 352 on a first edge 221 of semiconductor fin 220 and a second edge dummy gate structure 353 on a second edge 222 of semiconductor fin 220. Herein, first edge 221 and second edge 222 are on opposite sides of first initial dummy gate structure 351. That is, first edge dummy gate structure 352 and second edge dummy gate structure 353 are disposed on opposite sides of first initial dummy gate structure 351.

It should be noted that, although FIG. 3 shows that first initial dummy gate structure 351 is disposed between first edge dummy gate structure 352 and second edge dummy gate structure 353, those skilled in the art will appreciate that first edge dummy gate structure 352 and second edge dummy gate structure 353 may also be formed with a plurality of initial dummy gate structures separated from each other, so that the scope of the present invention is not limited to the case shown in FIG. 3.

In one embodiment, spacers on opposite sides of first initial dummy gate structure 351 are referred to as first spacers, spacers on opposite sides of first edge dummy gate structure 352 are referred to as second spacers, and spacers on opposite sides of second edge dummy gate structure 353 are referred to as third spacers.

In one embodiment, the closest distance between first and second spacers is referred to as a first distance. Referring to FIG. 3, the distance between the first spacer on the left side of first initial dummy gate structure 351 and the second spacer on the right side of first edge dummy gate structure 352 is referred to as the first distance. In one embodiment, the first distance may be 2 to 4 times the critical size of first initial dummy gate structure 351 (e.g., the cross-sectional width of first initial dummy gate structure 351 shown in FIG. 3), preferably 3 times.

In one embodiment, the closest distance between first and third spacers is referred to as a second distance. Referring to FIG. 3, the distance between the first spacer on the right side of first initial dummy gate structure 351 and the third spacer on the left side of second edge dummy gate structure 353 is referred to as the second distance. In one embodiment, the second distance may be 2 to 4 times the critical size of first initial dummy gate structure 351 (e.g., the cross-sectional width of first initial dummy gate structure 351 shown in FIG. 3), preferably 3 times.

Referring back to FIG. 1, at S103, the method may further include forming a raised source/drain region on the semiconductor fin and between each of the initial dummy gate structures.

Figure 4:
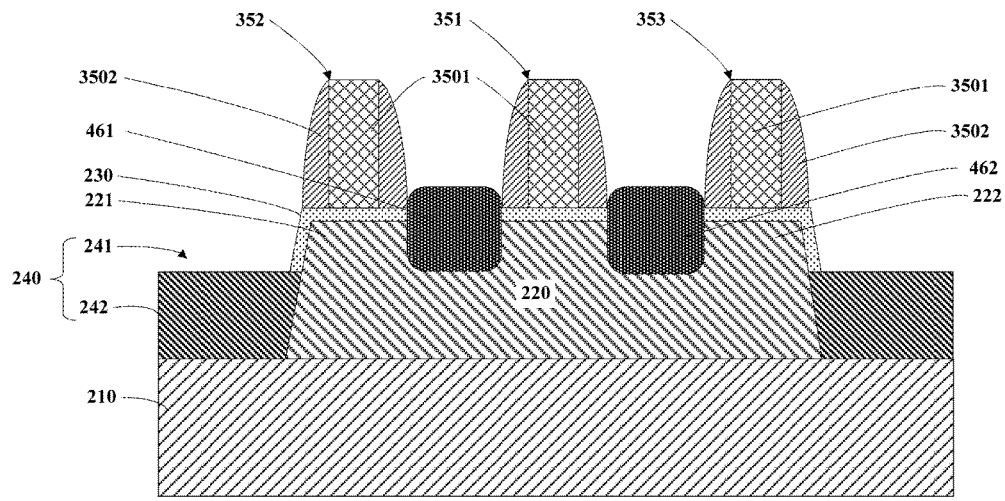

FIG. 4 is a cross-sectional view illustrating an intermediate stage of a semiconductor device according to S103. As shown in FIG. 4, a raised source/drain region is formed on semiconductor fin 220 and between each of the initial dummy gate structures through an etching process and an epitaxial process. In one embodiment, the source/drain region may include a first source 461 disposed between first initial dummy gate structure 351 and first edge dummy gate structure 352. In one embodiment, the source/drain region may include a first drain 462 disposed between first initial dummy gate structure 351 and second edge dummy gate structure 353.

In one embodiment, the method may also include performing an annealing process on the semiconductor structure after the source/drain region is formed.

Referring back to FIG. 1, at S104, the method may further include forming an interlayer dielectric layer surrounding the plurality of initial dummy gate structures and the source/drain region and exposing an upper surface of the initial dummy gates of the plurality of initial dummy gate structures.

Figure 6:
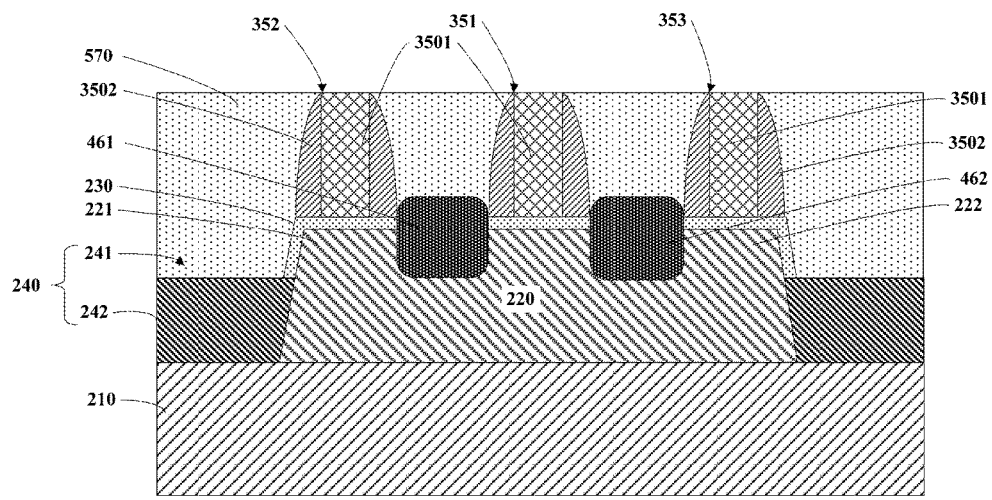

FIG. 6 is a cross-sectional view illustrating an intermediate stage of a semiconductor device according to S104. As shown in FIG. 6, an interlayer dielectric layer 570 is formed surrounding the plurality of initial dummy gate structures and the source/drain region and exposing an upper surface of the initial dummy gates 3501 of the plurality of initial dummy gate structures. Interlayer dielectric layer 570 may include silicon dioxide.

Figure 5:
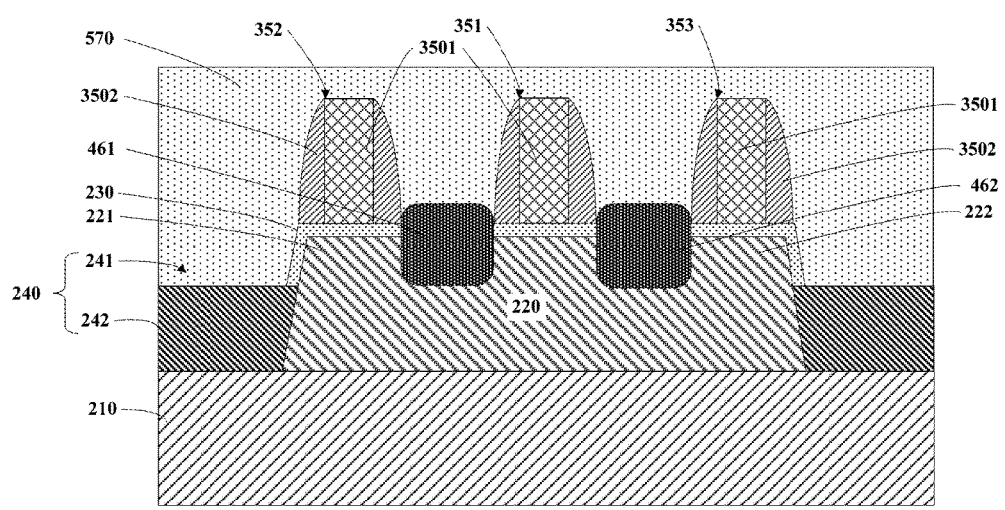

Processes of S104 will be described with reference to FIGS. 5 and 6. In one embodiment, S104 may include forming interlayer dielectric layer 570 on the substructure of FIG. 4 using a deposition process, as shown in FIG. 5. Optionally, S104 may also include planarizing (e.g., chemical mechanical polishing process) on interlayer dielectric layer 570 to expose an upper surface of the initial dummy gates of the plurality of initial dummy gate structures, e.g., exposing the upper surface of first initial dummy gate structure 351, first edge dummy gate structure 352, and second edge dummy gate structure 353.

Referring back to FIG. 1, at S105, the method may further include removing the exposed initial dummy gates and portions of the initial insulator layer below the exposed initial dummy gates to form a plurality of recesses.

Figure 7:
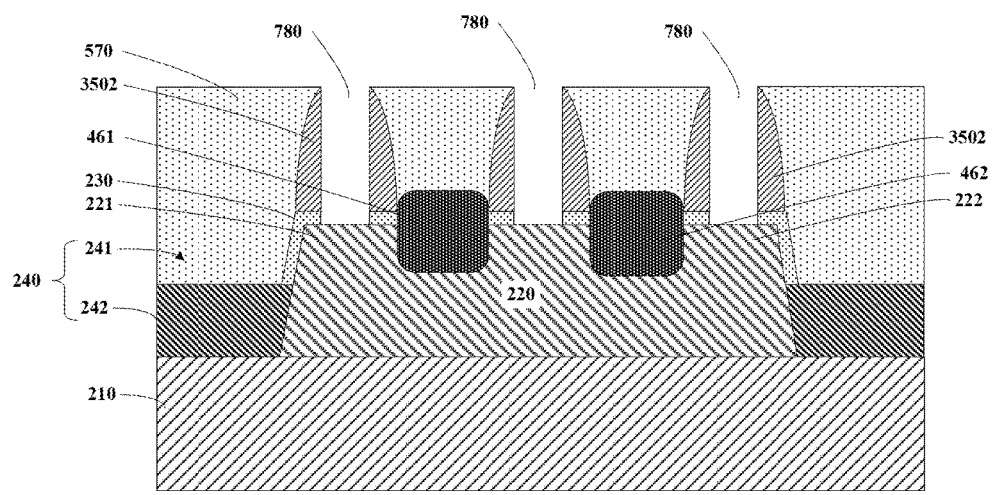

FIG. 7 is a cross-sectional view illustrating an intermediate stage of a semiconductor device according to S105. As shown in FIG. 7, the exposed initial dummy gates 3501 and portions of the initial insulator layer below the exposed initial dummy gates are removed to form a plurality of recesses 780.

Referring back to FIG. 1, at S106, the method may further include forming a gate insulator layer and a gate on the gate insulator layer in the plurality of recesses to form a plurality of gate structures that are separated from each other. The plurality of gate structures include at least a dummy gate structure on the edge of the semiconductor fin, and a first gate structure spaced apart from the dummy gate structure.

Figure 11:
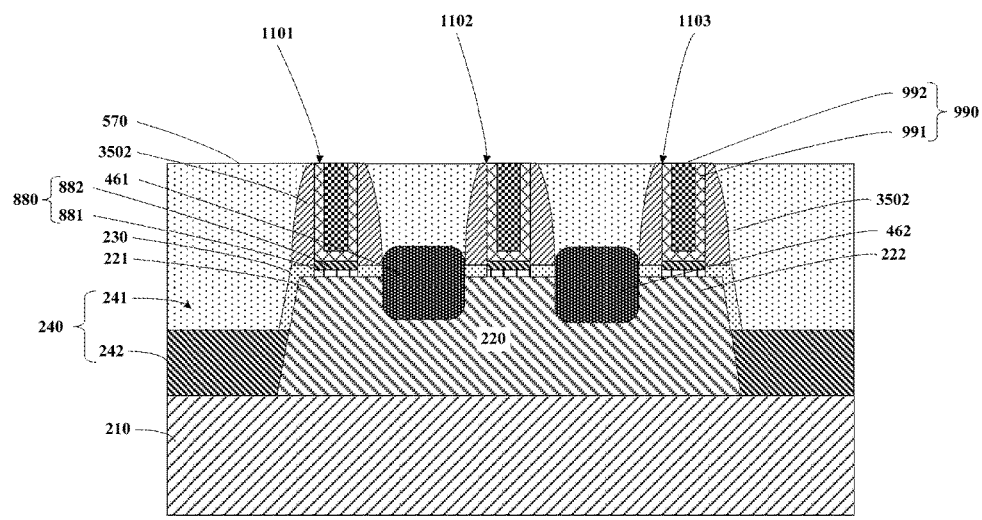

FIG. 11 is a cross-sectional view illustrating an intermediate stage of a semiconductor device according to S106. As shown in FIG. 11, a gate insulator layer 880 is formed in the plurality of recesses 780, and a gate 990 is formed on gate insulator layer 880 in the plurality of recesses to form a plurality of gate structures that are separated from each other. The plurality of gate structures include at least a dummy gate structure on the edge of the semiconductor fin, and a first gate structure 1102 is spaced apart from the dummy gate structure.

In one embodiment, the dummy gate structure may include a first dummy gate structure 1101 on first edge 221 of semiconductor fin 220 and a second dummy gate structure 1103 on second edge 222 of semiconductor fin 220. First dummy gate structure 1101 and second dummy gate structure 1103 are disposed on opposite sides of first gate structure 1102.

In one embodiment, first source 461 is disposed between first dummy gate structure 1101 and first gate structure 1102, i.e., the source/drain region may include first source 461. In one embodiment, first drain 462 is disposed between second dummy gate structure 1103 and first dummy gate structure 1101, i.e., the source/drain region may include first drain 462.

In one embodiment, gate insulator layer 880 may include an interface layer (IL) 881 on a portion of the surface of the semiconductor fin and a high-k dielectric constant layer 882 on interface layer 881. The interface layer may include silicon dioxide. The high-k dielectric constant layer may include hafnium oxide ($HfO_2$), zirconium dioxide, or titanium dioxide.

In one embodiment, gate 990 may include a work function adjusting layer 991 on high-k dielectric constant layer 882, and a conductive material layer 992 on work function adjusting layer 991. In the case where semiconductor fin 220 is p-type doped, work function adjusting layer 991 may be an NMOS work function adjusting layer. For example, the NMOS work function adjusting layer may include titanium aluminum alloy (TiAl). In the case where semiconductor fin 220 is n-type doped, work function adjusting layer 991 may be a PMOS work function adjusting layer. For example, the PMOS work function adjusting layer may include titanium nitrite (TiN) or tantalum nitride (TaN). In one embodiment, conductive material layer 992 may include a metal such as tungsten.

The process of forming the gate insulator layer and the gate in the recesses (i.e., step S106) will be described in detail below with reference to FIGS. 8 through 11.

Figure 8:
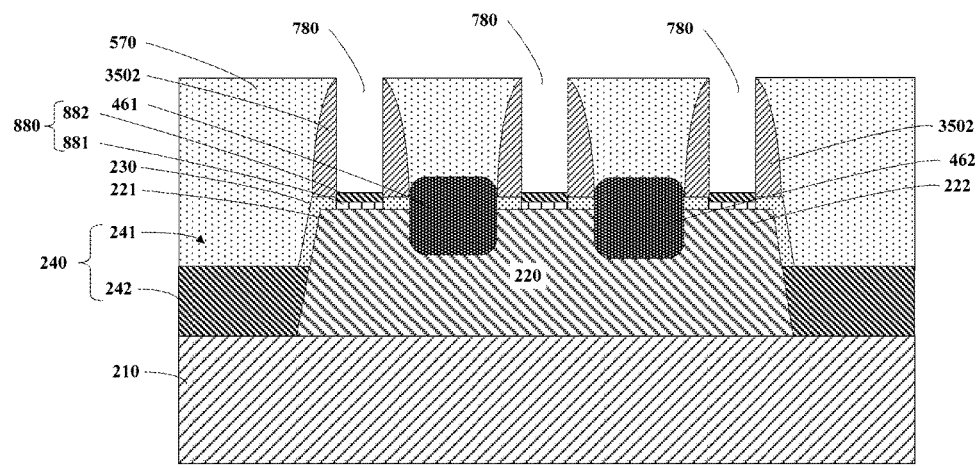

In one embodiment, S106 may include forming an interface layer 881 on the bottom of recesses 780 using a deposition process and a high-k dielectric layer 882 on interface layer 881, as shown in FIG. 8. In an example embodiment, interface layer 881 and high-k dielectric layer 882 together form a gate insulator layer 880.

Figure 9:
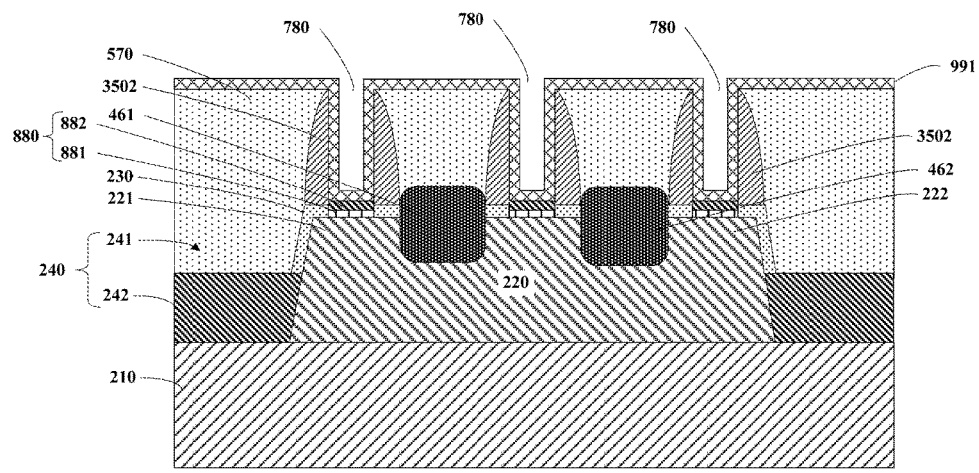

In one embodiment, S106 may also include forming a work function adjusting layer 991 on an interlayer dielectric layer 570, sidewalls of recesses 780 and high-k dielectric layer 882 using a deposition process, as shown in FIG. 9.

Figure 10:
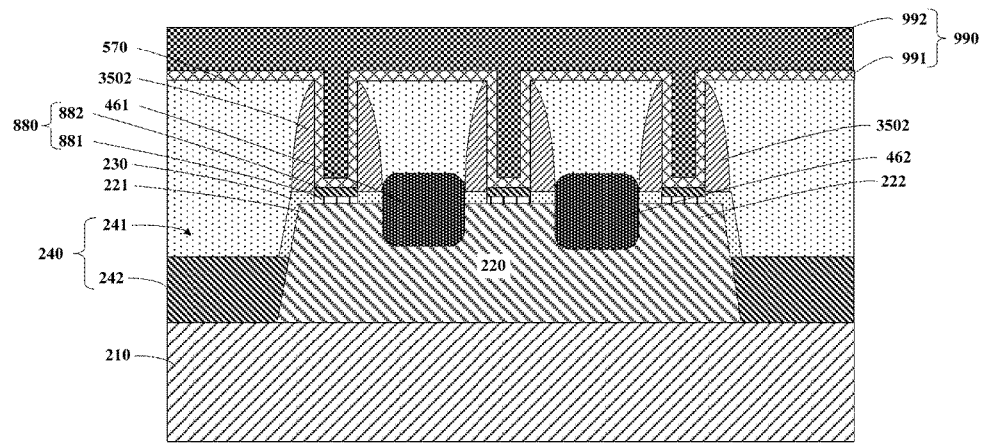

In one embodiment, S106 may further include forming a conductive material layer 992 on the structure shown in FIG. 9 using a deposition process to fill recesses 780, as shown in FIG. 10.

In one embodiment, S106 may also include planarizing (e.g., using a chemical mechanical polishing process) on the structure shown in FIG. 10 to expose the upper surface of interlayer dielectric layer 570, thereby forming a plurality of gate structures separated from each other by interlayer dielectric layer 570, such as first dummy gate structure 1101, first gate structure 1102, and second dummy gate structure 1103, as shown in FIG. 11. Work function adjusting layer 991 and conductive material layer 992 are collectively referred to as gate 990.

Referring back to FIG. 1, at S107, the method may further include forming a first dielectric layer on the interlayer dielectric layer covering the plurality of gate structures.

Figure 12:
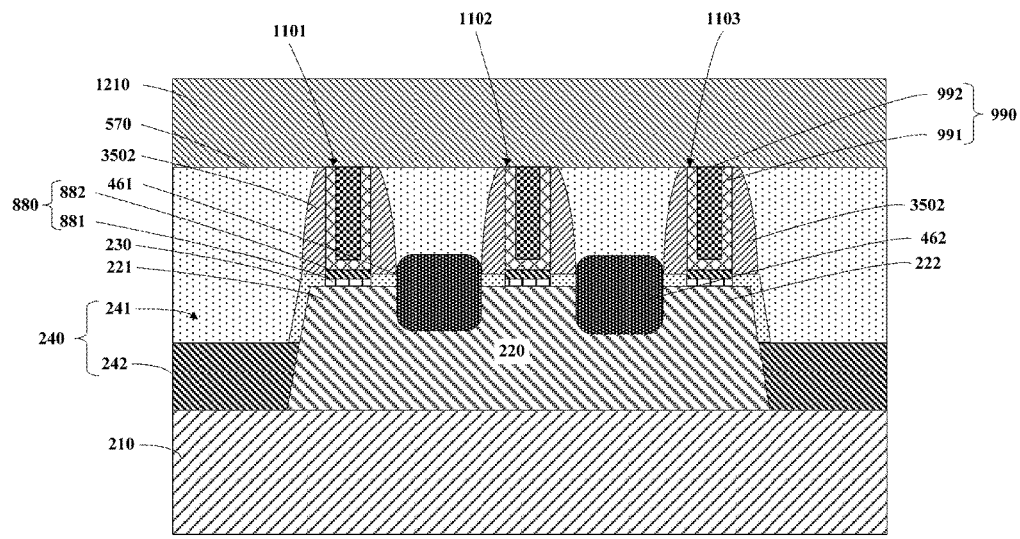

FIG. 12 is a cross-sectional view illustrating an intermediate stage of a semiconductor device according to S107. As shown in FIG. 12, a first dielectric layer 1210 is formed on interlayer dielectric layer 570 covering the plurality of gate structures using, for example, a deposition process. The first dielectric layer may be an inter-metal dielectric (IMD) layer and include silicon dioxide.

Referring back to FIG. 1, at S108, the method may further include forming a first contact through the first dielectric layer and the interlayer dielectric layer to the source or drain and a dummy gate contact through the first dielectric layer to the gates of the dummy gate structures.

Figure 14:
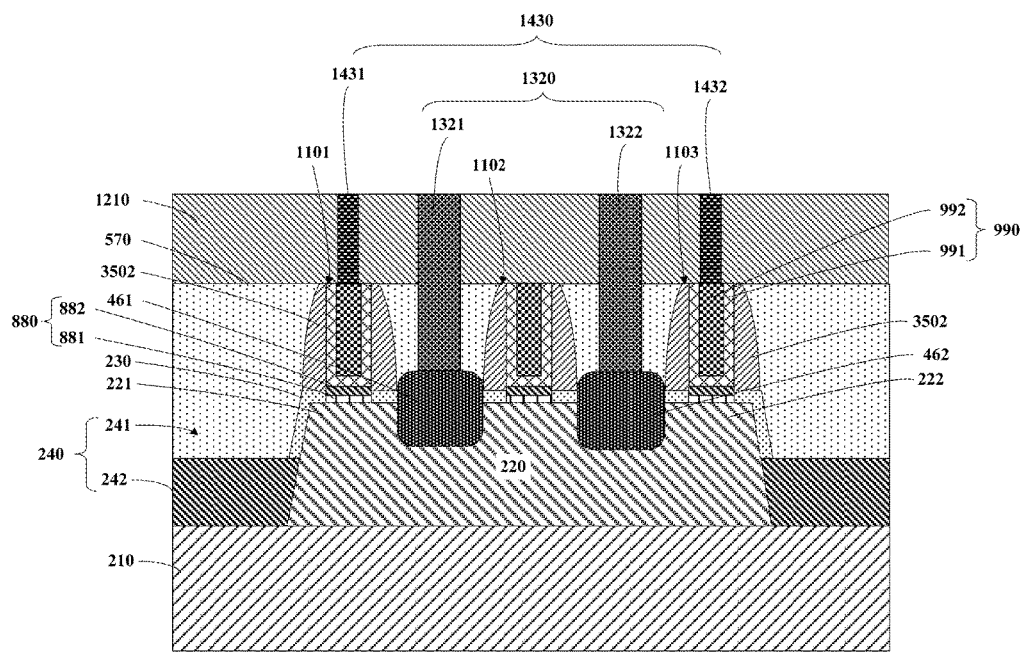

FIG. 14 is a cross-sectional view illustrating an intermediate stage of a semiconductor device according to S108. As shown in FIG. 14, a first contact 1320 is formed through first dielectric layer 1210 and interlayer dielectric layer 570 to the source or drain and a dummy gate contact 1430 is formed through first dielectric layer 1210 to the gates of the dummy gate structures. In an example embodiment, first contact 1320 and dummy gate contact 1430 may include a metal such as copper or tungsten.

In one embodiment, first contact 1320 may include a first source contact 1321 to first source 461 and a first drain contact 1322 to first drain 462, as shown in FIG. 14.

In one embodiment, dummy gate contact 1430 may include a first dummy gate contact 1431 to the gate of first dummy gate structure 1101 and a second dummy gate contact 1432 to the gate of second dummy gate structure 1103.

The process of forming the first contact and the dummy gate contact (i.e., step S108) will be described in detail below with reference to FIGS. 13 and 14.

Figure 13:
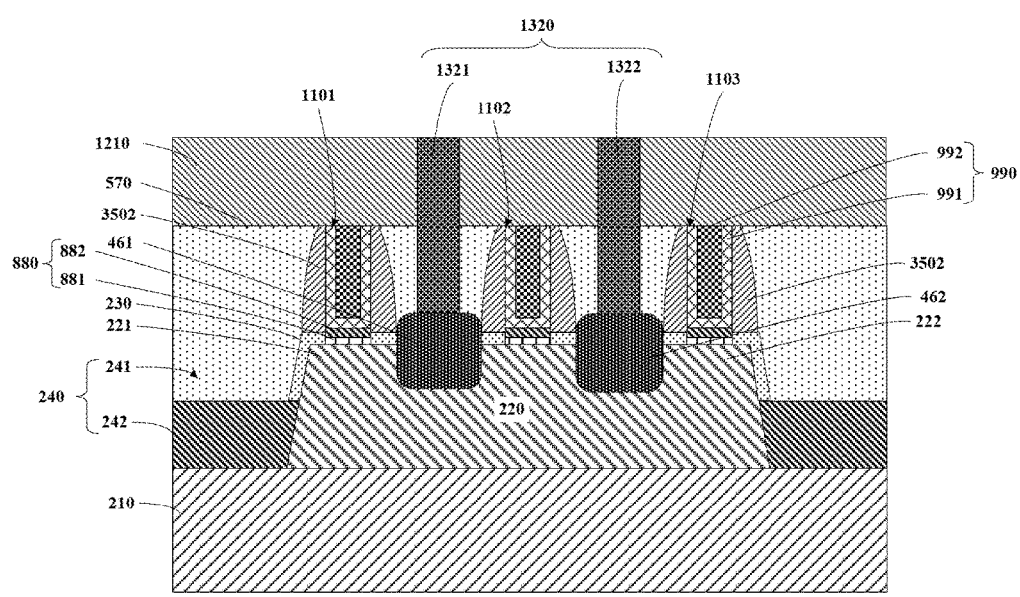

In one embodiment, referring to FIG. 13, S108 may include forming a first contact 1320 through first dielectric layer 1210 and interlayer dielectric layer 570 to the source or drain, for example, forming a first source contact 1321 to a first source 461 and forming a first drain contact 1322 to a first drain 462. In one embodiment, a first though-hole may be first formed to the source/drain region, thereafter a metal such as copper or tungsten may be deposited to fill the first through-hole to form the first contact.

In one embodiment, referring to FIG. 14, S108 may also include forming a dummy gate contact 1430 through first dielectric layer 1210 to the gates of the dummy gate structures, for example, forming a first dummy gate contact 1431 to the gate of first dummy gate structure 1101 and forming a second dummy gate contact 1432 to the gate of first dummy gate structure 1103. In one embodiment, a second through-hole may be first formed to the gates of the dummy gate structures, thereafter a metal such as copper or tungsten may be deposited to fill the second through-hole to form the dummy gate contact.

The process of forming the first contact and the dummy gate contact is thus described in the above sections. Those skilled in the art will appreciate that the order of forming the first contact and the dummy gate contact is described as an example, and the present invention is not limited thereto. For example, the dummy gate contact may be first formed, and the first contact is then formed. Thus, the scope of the present invention is not limited thereto.

Referring back to FIG. 1, at S109, the method may further include forming a metal connector on the first dielectric layer in contact with the dummy gate contact and the first contact.

Figure 15:
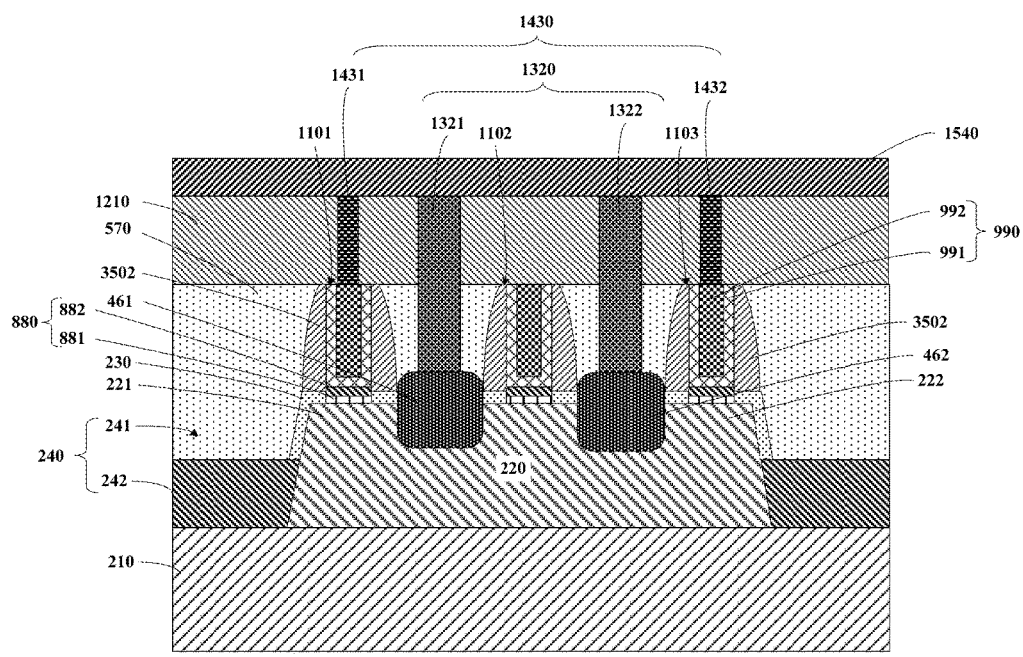

FIG. 15 is a cross-sectional view illustrating an intermediate stage of a semiconductor device according to S109. As shown in FIG. 15, a metal connector 1540 is formed on first dielectric layer 1210 in contact with dummy gate contact 1430 and in contact with first contact 1320. In one embodiment, the metal connection may include copper, tungsten, or aluminum. By forming the metal connector, the gates of the dummy gate structures are electrically connected to the source or drain to the same potential.

In one embodiment, metal connector 1540 is in contact with first dummy gate contact 1431, second dummy gate contact 1432, first source contact 1321, and first drain contact 1322. In one embodiment, metal connector 1540 is connected to ground.

Thus, embodiments of the present invention provide a method of manufacturing a varactor transistor. Based on the described method, the source and drain of the transistor have a regular morphology.

The present inventor discovered that, if the dummy gate structures are at a floating state, there may be a potential difference between dummy gate structures and the first contact due to capacitive coupling, thereby generating parasitic capacitance that may affect the device performance. In the case where the distance between the first contact and the spacers of the dummy gate structures is reduced, the parasitic capacitance will increase, which worsens the problem. Embodiments of the present invention can reduce or eliminate the parasitic capacitance by electrically connecting the gates of the dummy gate structures to the source/drain region to the same potential to improve the stability of the device performance.

Further, embodiments of the present invention can increase the capacitor tuning range of a varactor transistor. The varactor tuning range is defined as the ratio of Cmax and Cmin, where Cmax is the maximum capacitance of the varactor and Cmin is the minimum capacitance of the varactor of the capacitance-voltage (C-V) characteristic curve. The minimum capacitance includes the parasitic capacitance. Since the parasitic capacitance has been reduced or eliminated according to the present invention, the minimum capacitance of the varactor is reduced so that the capacitance tuning range of the varactor is increased.

Embodiments of the present invention also provide a varactor transistor. Referring to FIG. 15, the varactor transistor may include a semiconductor fin 220 having a first conductivity type. The varactor transistor may further include a plurality of gate structures surrounding a portion of semiconductor fin 220 and separated from each other. The plurality of gate structures include at least a dummy gate structure on an edge of semiconductor fin 220 and a first gate structure 1102 spaced apart from the dummy gate structure. Each gate structure includes a gate insulator layer 880 on a portion of the surface of semiconductor fin 220, a gate 990 on gate insulator layer 880, a spacer 3502 on sidewalls of the gate.

In one embodiment, the dummy gate structure may include a first edge dummy gate structure 1101 on a first edge 221 of semiconductor fin 220 and a second edge dummy gate structure 1103 on a second edge 222 of semiconductor fin 220. First edge dummy gate structure 1101 and second edge dummy gate structure 1103 are disposed on opposite sides of first gate structure 1102. Herein, first edge 221 and second edge 222 are on opposite sides of first gate structure 1102.

In one embodiment, gate insulator layer 880 may include an interface layer 881 on a portion of the surface of semiconductor fin 220 and a high-k dielectric constant layer 882 on interface layer 881. The interface layer may include silicon dioxide. The high-k dielectric constant layer may include hafnium oxide ($HfO_2$), zirconium dioxide, or titanium dioxide.

In one embodiment, the gate includes a work function adjusting layer 991 on high-k dielectric constant layer 882, and a conductive material layer 992 on work function adjusting layer 991. In the case where semiconductor fin 220 is p-type doped, work function adjusting layer 991 may be an NMOS work function adjusting layer. For example, the NMOS work function adjusting layer may include titanium aluminum alloy (TiAl). In the case where semiconductor fin 220 is n-type doped, work function adjusting layer 991 may be a PMOS work function adjusting layer. For example, the PMOS work function adjusting layer may include titanium nitrite (TiN) or tantalum nitride (TaN). In one embodiment, conductive material layer 992 may include a metal such as tungsten.

In one embodiment, the varactor transistor may further include a raised source/drain region on the semiconductor fin and disposed between the dummy gate structures and the first gate structure. The raised source/drain region has a regular morphology. The gate of a dummy gate structure is electrically connected to the raised source/drain region at the same potential. For example, the dummy gate structure includes a gate connected to the source/drain region.

In one embodiment, the source/drain region may include a first source 461 disposed between first dummy gate structure 1101 and first gate structure 1102. In one embodiment, the source/drain region may include a drain 462 disposed between second dummy gate structure 1103 and first gate structure 1102. In an example embodiment, first source 461 of first dummy gate structure 1101 and first drain 462 of second dummy gate structure 1103 are electrically connected to the same potential.

According to embodiments of the present invention, parasitic capacitance can be eliminated as much as possible by connecting the gates of the dummy gate structures to the same potential as the source or drain so that the device performance is more stable, and the varactor transistor has a larger tuning range.

In one embodiment, referring to FIG. 15, the varactor transistor may also include a substrate 210 having a second conductivity type. In an example embodiment, the first conductivity type is p-type, and the second conductivity type is n-type. In another example embodiment, the first conductivity type is n-type, and the second conductivity type is p-type. Semiconductor fin 220 is formed on substrate 210, and a reverse pn junction is formed between semiconductor fin 220 and substrate 210.

In one embodiment, referring to FIG. 15, the varactor transistor may further include a first contact 1320 connected to the source and a dummy gate contact 1430 connected to the gate of the dummy gate structure.

In one embodiment, first contact 1320 may include a first source contact 1321 connected to first source 461 and a first drain contact 1322 connected to first drain 462. In one embodiment, dummy gate contact 1430 may include a first dummy gate contact 1431 connected to the gate of first dummy gate structure 1101, and a second dummy gate contact 1432 connected to the gate of second dummy gate structure 1103. First source contact 1321, first drain contact 1322, first dummy gate contact 1431 and second dummy gate contact 1432 are connected to each other. In one embodiment, first source contact 1321, first drain contact 1322, first dummy gate contact 1431 and second dummy gate contact 1432 are connected to ground.

In one embodiment, referring to FIG. 15, the varactor transistor may also include a trench isolation structure 240 disposed around semiconductor fin 220. Trench isolation structure 240 may include a trench 241 adjacent to semiconductor fin 220 and a first insulator layer 242 filling trench 241. First insulator layer 242 may include silicon dioxide.

In one embodiment, referring to FIG. 15, the varactor transistor may also include an interlayer dielectric layer 570 on first insulator layer 242 and surrounding the plurality of gate structures and a portion of first source contact 1321 and a portion of first drain contact 1322. Interlayer dielectric layer 570 may include a silicon dioxide.

In one embodiment, referring to FIG. 15, the varactor transistor may also include a first dielectric layer 1210 on interlayer dielectric layer 570 and surrounding first dummy gate contact 1431, second dummy gate contact 1432, a portion of first source contact 1321 and a portion of first drain contact 1322. First dielectric layer 1210 exposes an upper surface of first dummy gate contact 1431, second dummy gate contact 1432, first source contact 1321, and first drain contact 1322. In a preferred embodiment, the upper surface of first dielectric layer 1210 is flush with the upper surface of first dummy gate contact 1431, second dummy gate contact 1432, first source contact 1321, and first drain contact 1322. The first dielectric layer may include silicon dioxide.

In one embodiment, referring to FIG. 15, the varactor transistor may also include a metal connector 1540 on first dielectric layer 1210 and electrically in contact with first dummy gate contact 1431, second dummy gate contact 1432, first source contact 1321, and first drain contact 1322. The metal connector may include copper, tungsten or aluminum. Metal connector 1540 electrically connects first dummy gate contact 1431, second dummy gate contact 1432, first source contact 1321, and first drain contact 1322 to the same potential. That is, the metal connector is such that the gates of the dummy gate structures are connected to the same potential as the source or drain, so that parasitic capacitance can be reduced or eliminated to obtain a stable performance and a larger capacitor tuning range of the varactor transistor.

Those of skill in the art will appreciate that the connection of the gates of the dummy gate structures to the source or drain in the above-described manner is exemplary only, the scope of the present invention is not limited thereto. Other manners and configurations of the connection of the gates of the dummy gate structures to the source or drain so that they have the same potential will fall within the scope of the invention.

In one embodiment, referring to FIG. 15, the varactor transistor may also include an initial insulator layer 230 disposed between interlayer dielectric layer 570 and semiconductor fin 220. The initial insulator layer may include silicon dioxide.

FIGS. 16A-16J are cross-sectional views illustrating intermediate stage of a semiconductor structure manufactured with a method according to some embodiments of the present invention. A method of manufacturing a semiconductor structure according to some embodiments of the present invention will be described in detail with reference to FIGS. 16A through 16J.

Figure 16A:
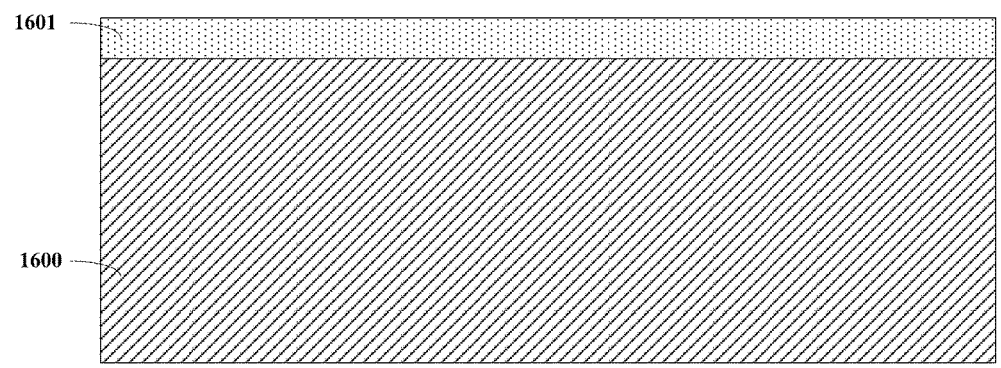
FIGS. 16A-16J are cross-sectional views illustrating intermediate stage of a semiconductor structure manufactured with a method according to some embodiments of the present invention.

Referring to FIG. 16A, a second insulator layer 1601 is formed as a buffer layer on a semiconductor substrate (e.g., a silicon substrate) 1600 using a deposition process. Second insulator layer 1601 may include silicon dioxide. In one embodiment, a doping (e.g., an ion implantation) process is performed into semiconductor substrate 1600 such that the semiconductor substrate is doped with a second conductivity type.

Figure 16B:
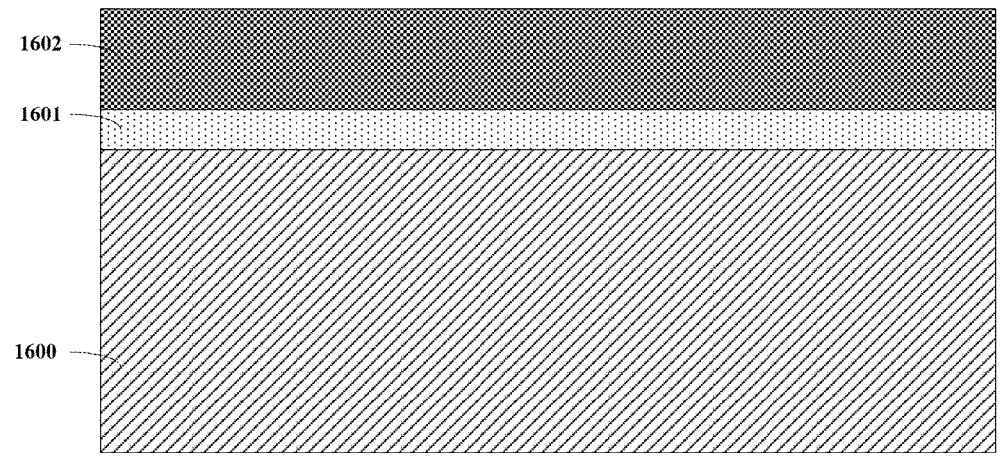

Next, referring to FIG. 16B, a hardmask layer 1602 is formed on second insulator layer 1601 using, for example, a deposition process. Hardmask layer 1602 may include silicon nitride.

Figure 16C:
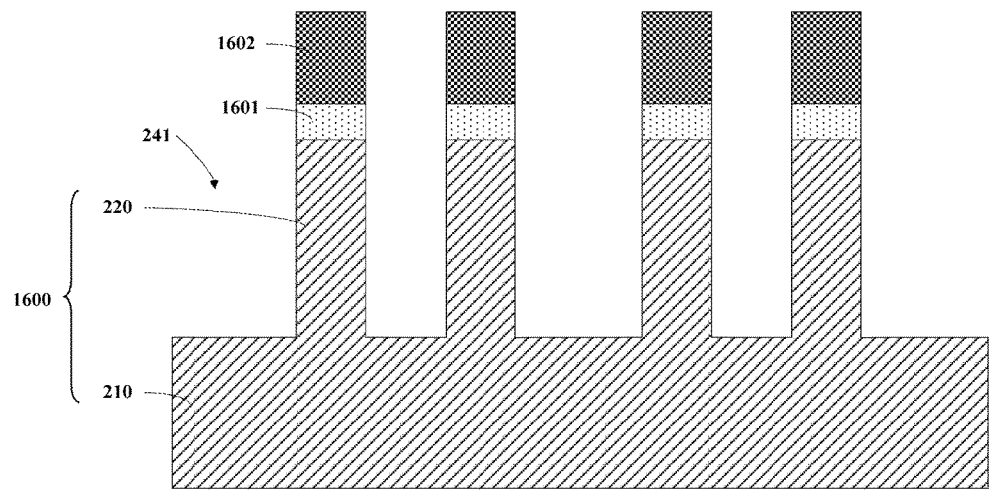

Next, referring to FIG. 16C, an etching process (e.g., using photolithography and etching processes) is performed on the structure shown in FIG. 16B to form a plurality of semiconductor fins 220. The portion below the semiconductor fins is substrate 210.

Figure 16D:
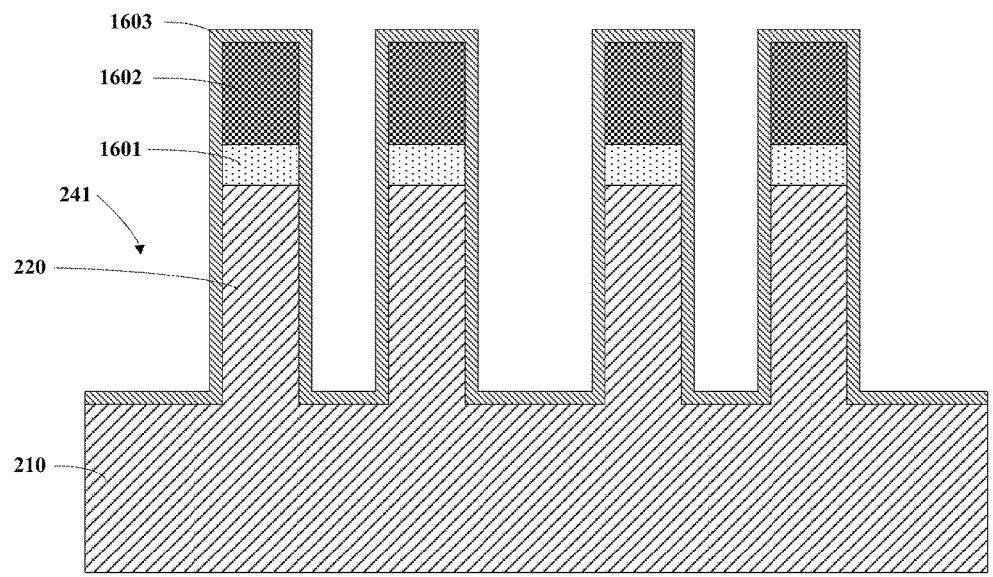

Next, referring to FIG. 16D, a third insulator layer 1603 is formed on the structure shown in FIG. 16D using, for example, a deposition process. Third insulator layer 1603 may include silicon dioxide.

Figure 16E:
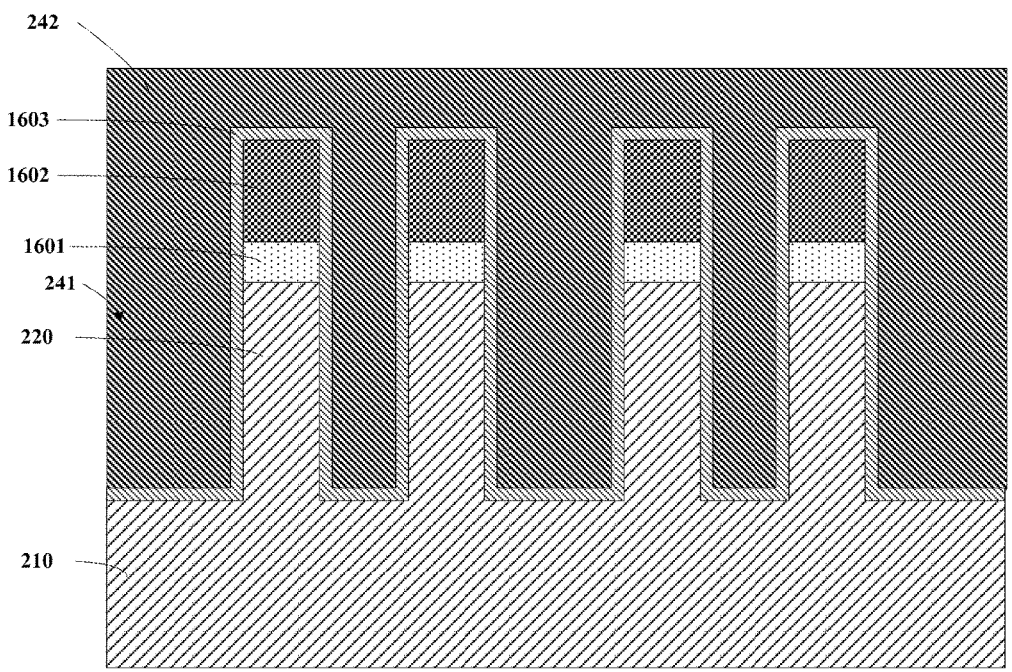

Next, referring to FIG. 16E, a first insulator layer 242 is formed on the structure shown in FIG. 16D using, for example, a deposition process such as a flowable chemical vapor deposition (FCVD) process to fill trenches 241 between the respective semiconductor fins.

Figure 16F:
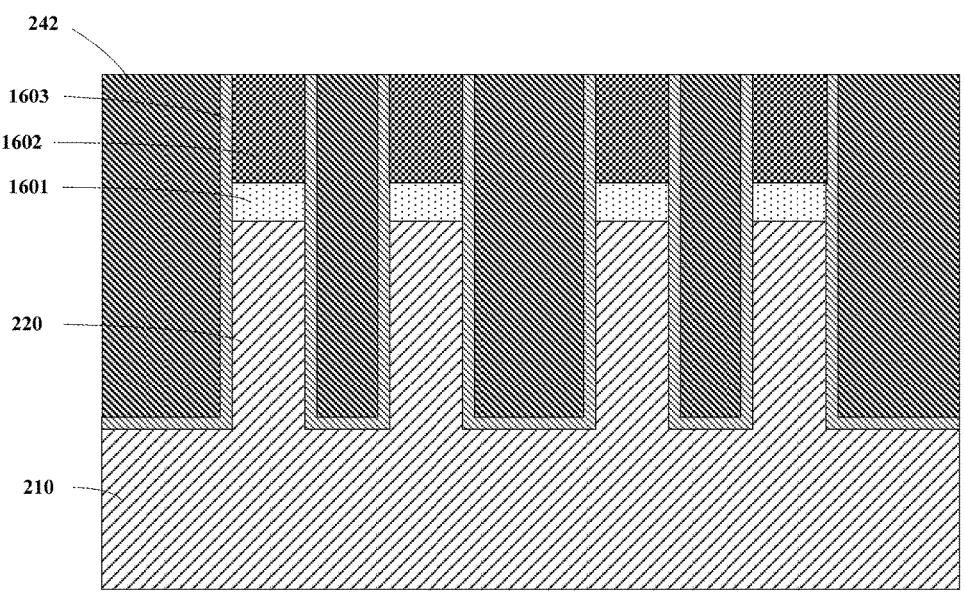

Next, referring to FIG. 16F, a planarization process is performed on first insulator layer 242 and third insulator layer 1603 to expose an upper surface of hardmask layer 1602.

Figure 16G:
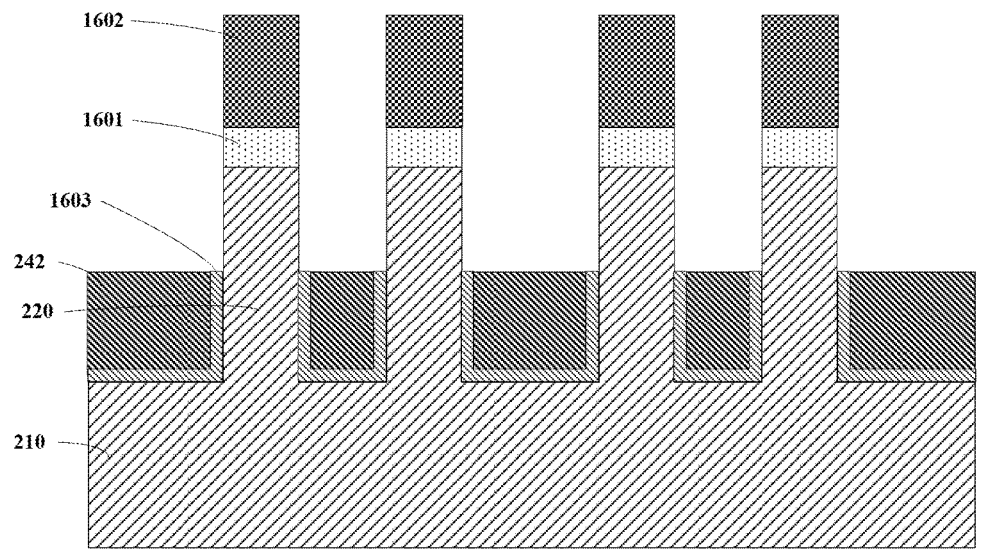

Next, referring to FIG. 16G, first insulator layer 242 and third insulator layer 1603 are etched back so that the semiconductor fins protrude from first insulator layer 242.

Figure 16H:
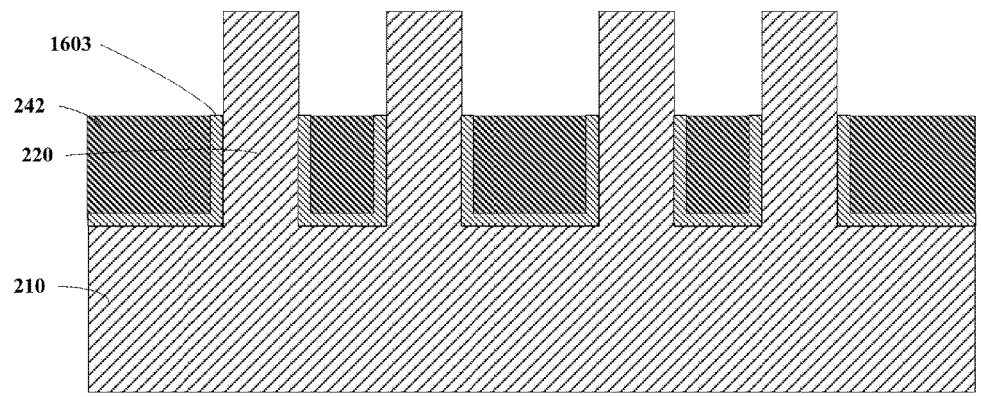

Next, referring to FIG. 16H, hardmask layer 1602 and second insulator layer 1601 are removed.

Figure 16I:
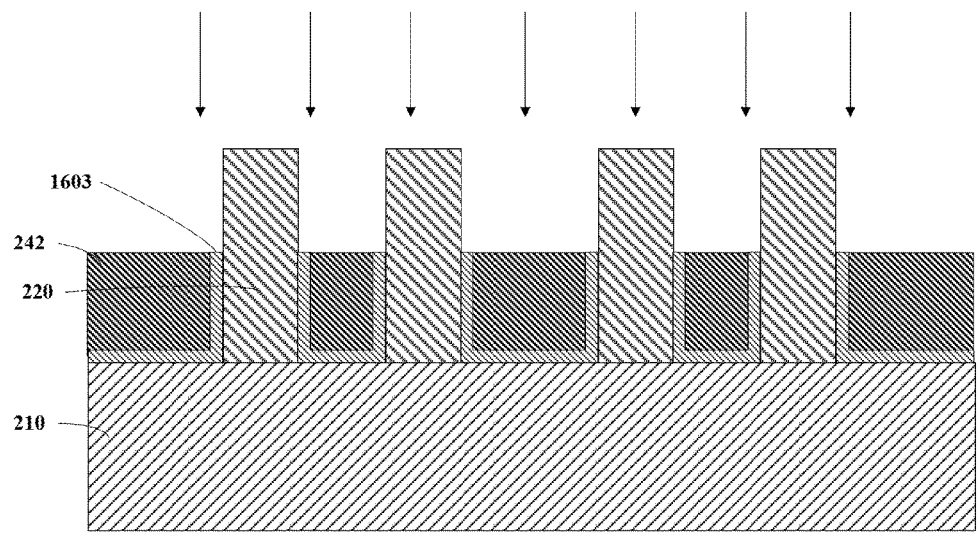

Next, referring to FIG. 16I, a doping (e.g., ion implantation) process is performed on semiconductor fins 220 such that the semiconductor fins have a first conductivity type that is different from the second conductivity type of substrate 210.

Figure 16J:
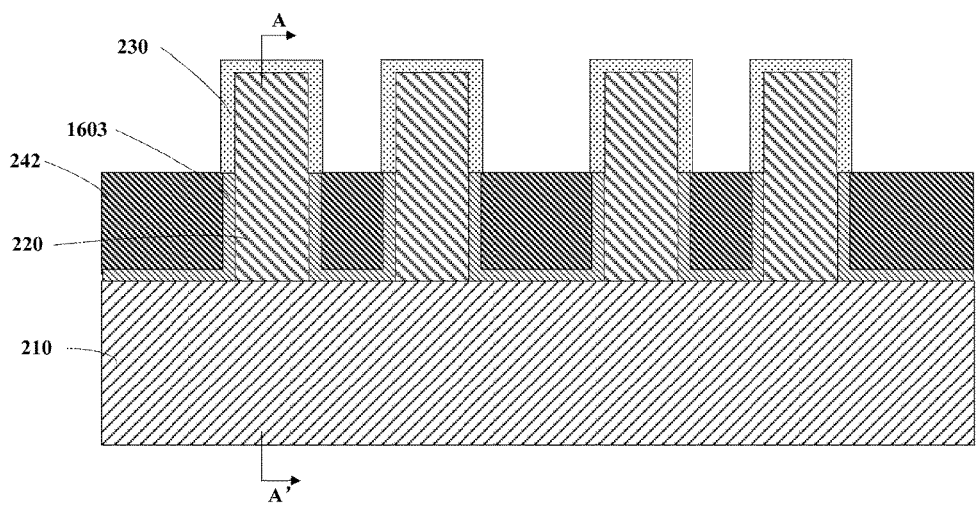

Next, referring to FIG. 16J, an initial insulator layer 230 is formed on a portion of the surface of semiconductor fins 220 using, for example, an oxidation process. In another embodiment, initial insulator layer 230 may be formed using a deposition process.

Thus, embodiments of the present invention provide a method of manufacturing a semiconductor structure. The cross-sectional view of the semiconductor structure shown in FIG. 2 can be considered as a cross-sectional view of the structure taken along the line A-A' in FIG. 16J. Third layer 1603 in FIG. 16J is omitted in FIG. 2. In some embodiments, the semiconductor structure may further include a third insulator layer 1603 disposed between first insulator layer 242 and substrate 210 and between first insulator layer 242 and semiconductor fin 210. In other embodiments, the semiconductor structure may not include the third insulator layer.

Thus, embodiments of the present invention provide detailed description of method of manufacturing a semiconductor device and a semiconductor structure, and a semiconductor device manufactured using the described methods. In the description, numerous specific details such as formation of fins, source, drain, trenches, and the like have not been described in detail in order not to obscure the embodiments of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A varactor transistor, comprising:
a semiconductor fin having a first conductivity type;
a plurality of gate structures separated from each other and surrounding a portion of the semiconductor fin, the plurality of gates structures comprising a first dummy gate structure on a first edge of the semiconductor fin, a second dummy gate structure on a second edge of the semiconductor fin, and a first gate structure between the first and second dummy gate structures and spaced apart from the first and second dummy gate structures, the first and second dummy gate structures and the gate structure each comprising a gate insulator layer on a surface portion of the semiconductor fin, a gate on the gate insulator layer, and a spacer on the gate;
a source disposed between the first dummy gate structure and the first gate structure;
a drain disposed between the second dummy gate structure and the first gate structure;
a source contact connected to the source and a drain contact connected to the drain; and
a first dummy gate contact connected to the gate of the first dummy gate structure and a second dummy gate contact connected to the gate of the second dummy gate structure,
wherein the source contact, drain contact, first dummy gate contact, and second dummy gate contact are connected to each other.

2. The varactor transistor of claim 1, further comprising a substrate having a second conductivity type different from the first conductivity type, the semiconductor fin on the substrate and a reverse pn junction formed between the semiconductor fin and the substrate.

3. The varactor transistor of claim 1, wherein the source contact, drain contact, first dummy gate contact and second dummy gate contact are connected to ground.

4. The varactor transistor of claim 1, further comprising a trench isolation structure around the semiconductor fin and comprising a trench adjacent to the semiconductor fin and a first insulating layer in the trench.

5. The varactor transistor of claim 4, further comprising an interlayer dielectric layer surrounding the plurality of gate structures and a portion of the source contact and a portion of the drain contact on the first insulator layer.

6. The varactor transistor of claim 5, further comprising a first dielectric layer surrounding the first dummy gate contact, a portion of the first source contact and a portion of the first drain contact,
wherein the first dielectric layer exposes an upper surface of the first dummy gate contact, the second dummy gate contact, the source contact, and the drain contact.

7. The varactor transistor of claim 6, further comprising a metal connector on the first dielectric layer and in contact with the first dummy gate contact, the second dummy gate contact, the source contact, and the drain contact.

8. The varactor transistor of claim 4, further comprising an initial insulator layer between the interlayer dielectric layer and the semiconductor fin.

9. The varactor transistor of claim 1, wherein the gate insulator layer comprises an interface layer on a surface portion of the semiconductor fin and a high-k dielectric layer on the interface layer.

10. The varactor transistor of claim 9, wherein the gate comprising a work function adjusting layer on the high-k dielectric layer on the interface layer and a conductive material layer on the work function adjusting layer.

11. The varactor transistor of claim 1, wherein the source and the drain each are disposed in a raised source region and in a raised drain region, respectively.

12. The varactor transistor of claim 7, wherein the metal connector connects the first dummy gate contact, the second dummy gate contact, the source contact, and the drain contact to ground.

13. The varactor transistor of claim 7, wherein the metal connector comprises copper, tungsten, or aluminum.

* * * * *